United States Patent
Udompanyavit et al.

(10) Patent No.: US 8,324,721 B2
(45) Date of Patent: Dec. 4, 2012

(54) INTEGRATED SHUNT RESISTOR WITH EXTERNAL CONTACT IN A SEMICONDUCTOR PACKAGE

(75) Inventors: Ubol Udompanyavit, Dallas, TX (US); Steve Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/412,347

(22) Filed: Mar. 5, 2012

(65) Prior Publication Data

US 2012/0199951 A1 Aug. 9, 2012

Related U.S. Application Data

(60) Continuation-in-part of application No. 12/910,933, filed on Oct. 25, 2010, now Pat. No. 8,129,228, which is a division of application No. 12/165,932, filed on Jul. 1, 2008, now Pat. No. 7,847,391.

(51) Int. Cl.
*H01L 23/48* (2006.01)
*H01L 23/52* (2006.01)

(52) U.S. Cl. ........ 257/692; 257/E23.043; 257/537; 257/669; 438/111; 438/123

(58) Field of Classification Search ........... 257/E23.043, 257/E23.031, E21.51, E23.124, 125, 143, 257/537, 666, 669, 674, 677, 690–692; 438/111, 438/122–125, FOR. 366, FOR. 377, FOR. 380
See application file for complete search history.

(56) References Cited

U.S. PATENT DOCUMENTS

| | | | | |
|---|---|---|---|---|
| 4,591,821 A * | 5/1986 | Paulson et al. | ................ | 338/308 |
| 5,023,684 A * | 6/1991 | Tsunoda | ........................ | 257/423 |
| 5,534,788 A * | 7/1996 | Smith et al. | ................... | 324/431 |
| 5,804,880 A * | 9/1998 | Mathew | ........................ | 257/779 |
| 6,225,684 B1 * | 5/2001 | Stitt et al. | ....................... | 257/666 |
| 6,621,140 B1 * | 9/2003 | Gibson et al. | ................. | 257/531 |
| 6,927,481 B2 * | 8/2005 | Gibson et al. | ................. | 257/666 |
| 7,005,325 B2 * | 2/2006 | Chow et al. | .................... | 438/123 |
| 2007/0063333 A1 * | 3/2007 | Mohd Arshad | ............... | 257/690 |

* cited by examiner

*Primary Examiner* — Chris Chu
(74) *Attorney, Agent, or Firm* — Steven A. Shaw; W. James Brady; Frederick J. Telecky, Jr.

(57) ABSTRACT

An integrated circuit package that comprises a lead frame 105, an integrated circuit located on the lead frame and a shunt resistor coupled to the integrated circuit. The shunt resistor has a lower temperature coefficient of resistance than the lead frame, and the lead frame has a lower resistivity than the shunt resistor. The shunt resistor has a low-resistance coupling to external leads of the lead frame, or, the shunt resistor has its own integrated external leads.

13 Claims, 7 Drawing Sheets

INTEGRATED SHUNT RESISTOR WITH EXTERNAL CONTACT IN A SEMICONDUCTOR PACKAGE

CROSS REFERENCE TO RELATED APPLICATIONS

This application is a Continuation-in-Part of and claims priority to U.S. application Ser. No. 12/910,933 filed Oct. 25, 2010, now U.S. Pat. No. 8,129,228 issued on Mar. 6, 2012. Said application is a Divisional of and claims priority to U.S. application Ser. No. 12/165,932 filed Jul. 1, 2010, now U.S. Pat. No. 7,847,391 issued on Dec. 7, 2010. Said application incorporated herein by reference.

TECHNICAL FIELD

Embodiments of the invention are directed to semiconductor packages and methods for manufacturing a semiconductor package.

BACKGROUND

Certain semiconductor devices are used as amplifiers dedicated to current or voltage sensing. Typically, the amplifier comprises an integrated circuit (IC) package, manufactured by one party, connected to a shunt resistor, manufactured by another party. The combination of separately manufactured IC packages and shunt resistors increases the area of the circuit board occupied by these elements. Attempts have been made to integrate a shunt resistor into the IC package, with parts of an IC lead frame being used as the shunt resistor.

SUMMARY

One aspect of the present disclosure provides an integrated circuit package. The package comprises a lead frame, an integrated circuit located on the lead frame and a shunt resistor coupled to the lead frame and to the integrated circuit. The shunt resistor has a lower temperature coefficient of resistance than the lead frame, and the lead frame has a lower resistivity than the shunt resistor. The shunt resistor has a low-resistance coupling to external leads of the lead frame. The shunt resistor has its own integrated external leads.

Another aspect of the present disclosure is an amplifier for current or voltage measurements. The amplifier comprises the above-described package, wherein the shunt resistance has its own external leads. A mold encompasses the lead frame, the shunt resistor, and the integrated circuit, except for the integrated external leads of the lead frame or the integrated external leads of the shunt resistor.

Another aspect of the present disclosure is method of manufacturing an integrated circuit package. The method comprises forming a lead frame, and coupling one of the above-described shunt resistors embodiments to the lead frame. The method further comprises attaching an integrated circuit to a surface of the lead frame and electrically connecting the integrated circuit to the shunt resistor and to the lead frame. The method further comprises encompassing the lead frame, the shunt resistor and the integrated circuit with a mold, except for external leads of the lead frame or of the shunt resistor.

BRIEF DESCRIPTION OF THE DRAWINGS

The disclosure is described with reference to example embodiments and to the accompanying drawings.

DETAILED DESCRIPTION

Figure 1:
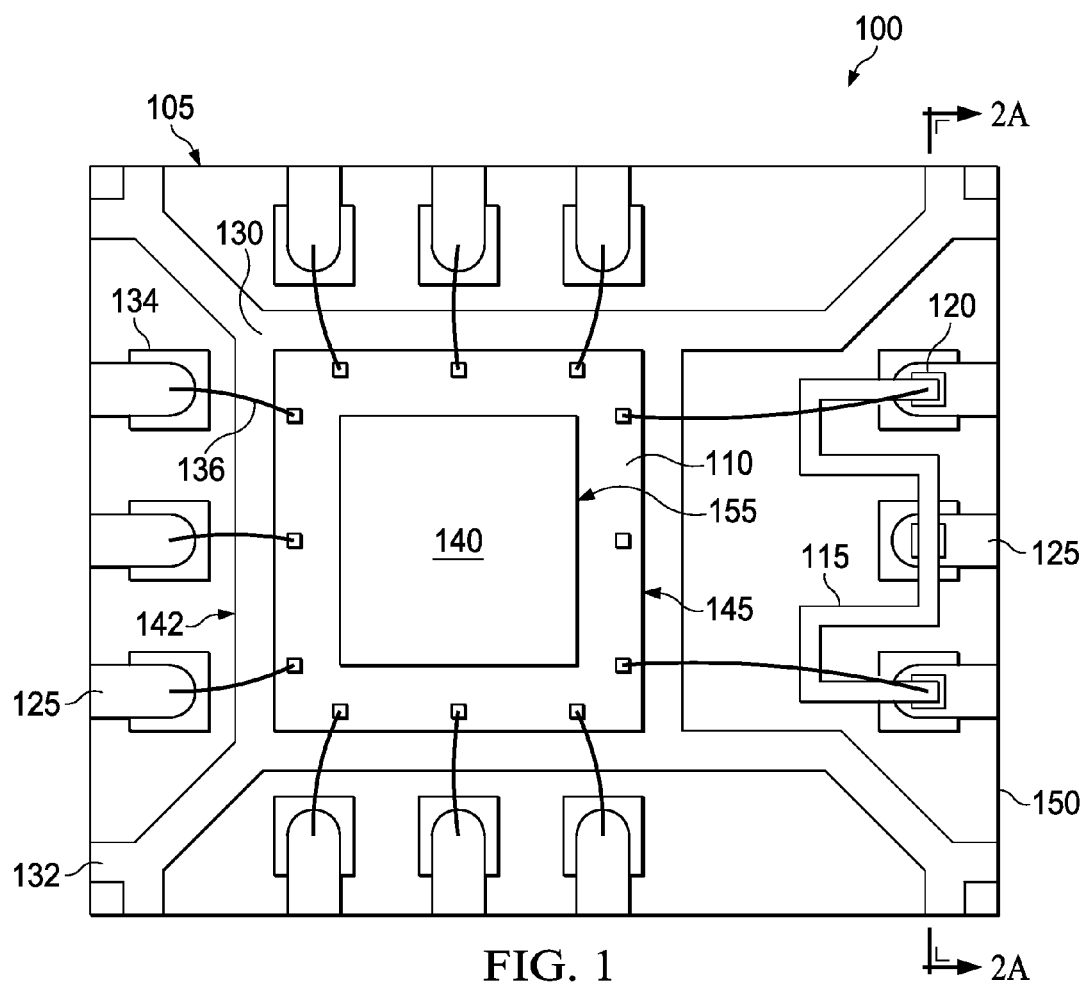
FIG. 1 illustrates a plan view of an example integrated circuit package of the present disclosure.

As part of the present disclosure, it was recognized that integrating a shunt resistor, as part of a lead frame, into an IC package is problematic for certain applications that require highly accurate current or voltage measurements and low resistive losses in and out of the IC package. Using part of a conventional lead frame material as the shunt resistor is not satisfactory, because the lead frame is typically made of a material having a high temperature co-efficient of resistivity (TCR). Consequently, the accuracy of current or voltage measurements suffers because of temperature-induced changes in the resistance of the shunt resistor.

In contrast, making the lead frame entirely out of a low TCR material is also unsatisfactory, because such materials have too high a resistivity. E.g., the high pin resistance of lead frames composed of low TCR materials results in an unacceptably high voltage loss when the IC and shunt resistor of the package are connected to an external device. Unfortunately, materials having both the desirably low TCR and low resistivity have not been discovered or recognized for today's required current and voltage sensing applications.

The present disclosure addresses the above-discussed problems by incorporating a shunt resistor made of a low TCR material into a package, not as part of the lead frame, but as a separate shunt resistor element of the package. The IC can be connected to external devices using external leads of the lead frame made of a low resistivity material. For its connection to external devices, the shunt resistor either has its own integrated external leads, or, has low resistance couplings to external leads of the low resistivity lead frame material. The resulting IC package has a new combination of properties that was not attainable in previous IC packages: a shunt resistor having a low TCR, and, minimal voltage losses from the package. Additionally, the IC package occupies less board space than separately-assembled IC packages and shunt resistors.

There are no existing process for manufacturing an IC package with this combination of low TCR and low resistivity materials. Indeed, the manufacture of a separate shunt resistor element made of low TCR material, and its attachment to a low resistivity lead frame material, presents new challenges that are not normally encountered by shunt resistor manufacturers.

For instance, it is difficult and expensive to manufacture a batch of shunt resistor elements with precisely the same dimensions for the entire batch. Variations in the dimensions of the shunt resistor element can give rise to large variations (e.g., about 30% variations) in its initial resistance. This difficulty was addressed by calibrating and compensating for such variations in resistance using the IC of the IC package. By measuring the resistance of each IC package after it is assembled, it is possible to use the IC to trim the output from the package to a desired value. As such, the total accuracy of the package for making current or voltage measurements is brought under the control of the IC package manufacturer.

It is also difficult to attach the separate shunt resistor element made of low TCR material to the low resistivity lead frame material without increasing the shunt's resistivity. This follows because standard attachment materials have a high resistivity which in turn increases the overall resistivity of the shunt resistor, with consequent high voltage losses. This difficulty was addressed by selecting a low-resistance coupling to attach the shunt resistor to external leads of the lead frame, or, by configuring the shunt resistor to have its own integrated external leads. The selection of the low resistance couplings, or, the integrated external leads are important to the successful operation of the IC package. The use of low resistance couplings or integrated external leads facilitates having the desired accuracy of current or voltage measurements while not contributing to the high voltage losses such as found in packages having shunt resistors made entirely of low resistivity, but moderate-to-high TCR lead frame material, or, made entirely of low TCR, but high resistivity material.

Figure 2A:
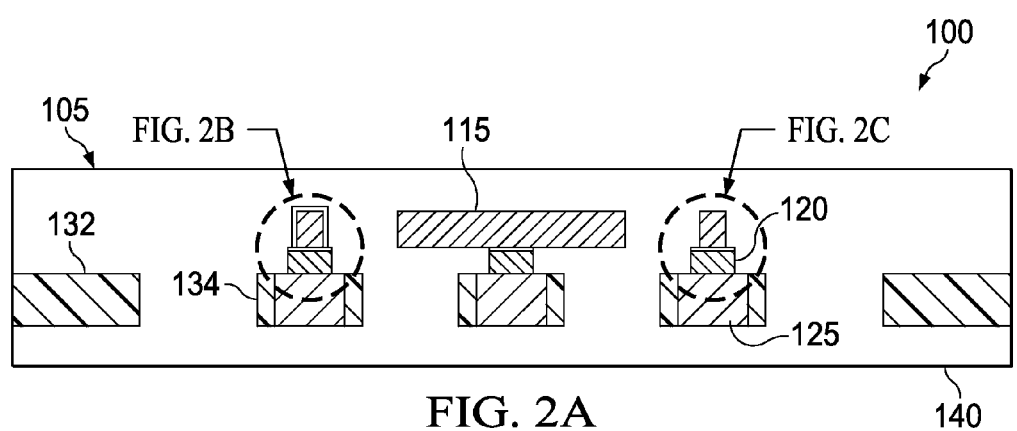
FIGS. 2A, 2B, and 2C present cross-sectional detail views of the integrated circuit package depicted in FIG. 1.

FIG. 1 shows a plan view of an example IC package 100 of the present disclosure. FIG. 2A shows a cross-sectional view of the same IC package 100 through view plan 2-2 (FIG. 1). The example package 100 depicted in FIG. 1 is a quad flat no-lead package (QFN). The package 100, however, can be any number of conventional type of lead-containing package, including plastic dual in-line integrated circuit packages (PDIP), small outline integrated circuits (SOICs), quad flat packages (QFP), thin QFPs (TQFPs), low profile QFPs (LPQFPs), Small Shrink Outline Plastic packages (SSOP), thin SSOPs (TSSOPs), thin very small-outline packages (TVSOPs), or other packages well known to those skilled in the art.

The example package 100 comprises a lead frame 105, an integrated circuit 110 located on the lead frame 105, and a shunt resistor 115 coupled to the lead frame 105 and to the IC 110. The shunt resistor 115 has a lower TCR than the lead frame 105, and the lead frame 105 has a lower resistivity than the shunt resistor 115. The shunt resistor 115 also has a low-resistance coupling 120 to external leads 125 of the lead frame 105.

In some embodiments, the TCR of the shunt resistor 115 is at least about 100 times lower than a TCR of the lead frame 105. Having the shunt resistor 115 made of a low TCR material facilitates providing a precise resistance as part of making an accurate measurement of current or voltage. The term low TCR material as used herein refers to a TCR of about ±100 ppm/° C. or less. E.g., in some cases, the TCR of the shunt resistor 115 is about ±100 ppm/° C. or less, and more preferably, about ±50 ppm or less, and even more preferably, about ±20 ppm or less. This is contrast to the substantially higher TCR of conventional lead frame materials, such as copper (TCR about ±4300 ppm/° C.) or aluminum (TCR about ±4500 ppm/° C.).

Some preferred embodiments of the shunt resistor 115 are composed of a metal alloy that includes copper, nickel and manganese. In some preferred embodiments, the metal alloy of the shunt resistor 115 includes all three of copper, nickel, and manganese individually present in weight percentages of at least about 1 percent or higher. In some cases, the first metal comprises about 90 to 50 weight percent copper and balance nickel and manganese. Some embodiments of the first metal can include additional elements such as iron, silicon and carbon in amounts of about 1 percent or less. Non-limiting example commercial materials that can be used as the metal alloy include: Constantan® (Cu:Ni:Mn:Fe 53.8:44.2:1.5:0.5), Ferry® Alloy (Cu:Ni:Fe:Mn:Si:C 55:42.4:1:1:0.5:0.1; Special Metals Corporation,), Shunt Manganin (Cu:Mn:Ni 87:9.5:3.5; Hamilton Precision Metals), and Manganin® (Cu:Mn:Ni 86:12:2; Isabellenhutte). All of these example metal alloys have a TCR of about ±20 ppm/° C. or less.

Having the lead frame 105, and its constituent leads 125, made of a low resistivity material advantageously minimizes voltage losses into and out of the package 100. The term low resistivity material refers to a material having a resistivity of about 3 μOhm·cm or less. By connecting the IC 110 and the shunt resistor 115 to external devices, through external leads 125 of the low resistivity lead frame material, voltage losses are minimized. Minimizing voltage losses are important in certain amplifier applications where, e.g., there is a 10 mV or less potential drop across the shunt resistor 115, because power losses in the system are undesirable and costly for applications operating on high voltage supplies or battery operation. For instance, a drop of more than 100 mV could cause thermal heating issues for shunt resistors that are encapsulated in plastic packaging materials or other moldings.

In some embodiments, the resistivity of the lead frame 105 is at least about 10 times lower than a resistivity of the shunt resistor 115. E.g., the lead frame 115 can comprise or in some cases, be substantially composed of, copper having a resistivity of about 1.5 μOhm·cm, or, aluminum having a resistivity of about 2.7 μOhm·cm). This is in contrast to the substantially higher resistivity of the above-described metal alloys of the shunt resistor. E.g., Manganin® can have a resistivity of about 45 μOhm·cm, and Constantan®, a resistivity of about 52 μOhm·cm. In addition to copper and aluminum, other example metals of the lead frame 115 include gold, silver and alloys thereof.

As noted above, it is important to the proper functioning of the package for the shunt resistor 115 to be connected to the external leads 125 by a low-resistance coupling 120. Using a higher resistance coupling can result in unacceptably high voltage losses into and out of the package 100. The low-resistance coupling 120 is defined as the interface between the shunt resistor 115 and the external leads 125 having a resistivity of about 2 mOhm·cm or less. More preferably, the resistivity of the low resistance coupling 120 is about 250 μOhm·cm or less.

In some cases, the low-resistance coupling 120 includes, or is, an additional material located in-between the shunt resistor 115 and the external leads 125. For instance, in some embodiments of the package 100, the low-resistance coupling 120 includes or is a solder, a conductive epoxy, or a thermal grease that has an electrical resistivity of about 2 mOhm·cm or less. Example materials that can serve as the low-resistance coupling 120 includes electrically conductive adhesives such as epoxy 8006 NS (Ablestik, Rancho Dominguez, Calif.), or thermal greases, or solder pastes with the appropriate low resistivity.

In other embodiments of the package 100, the low-resistance coupling 120 includes, or is, one or more metal studs or rivets having an electrical resistivity of about 2 mOhm·cm or less. Example metal studs or rivets can be composed of substantially the same material as the lead frame 105, or, a different low resistivity material.

Figure 3:
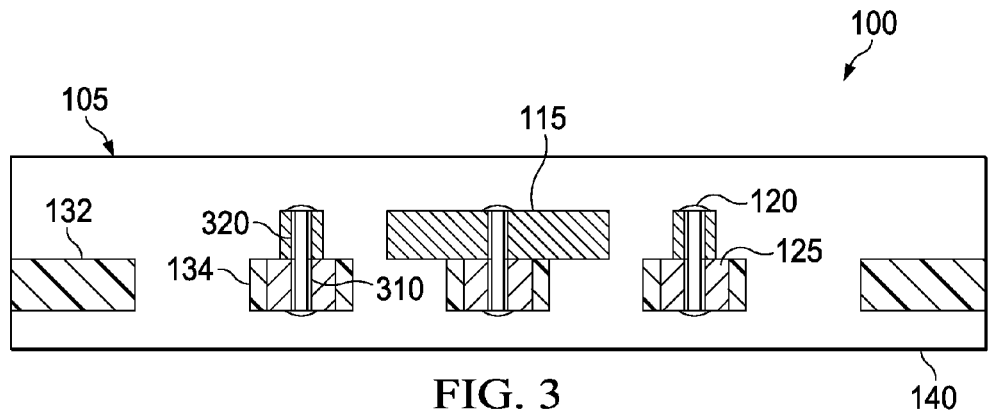
FIGS. 3-5 present cross-sectional detail views of alternative embodiments of the integrated circuit package depicted in FIG. 1.

FIG. 3 shows a cross-sectional view of an alternative IC package 100, analogous to the view depicted in FIG. 2A. The low-resistance coupling 120, configured as metal rivets, spans openings 310 in the leads 125 and openings 320 in the shunt resistor 115, to couple the shunt resistor 115 and leads 125 together.

Figure 4:
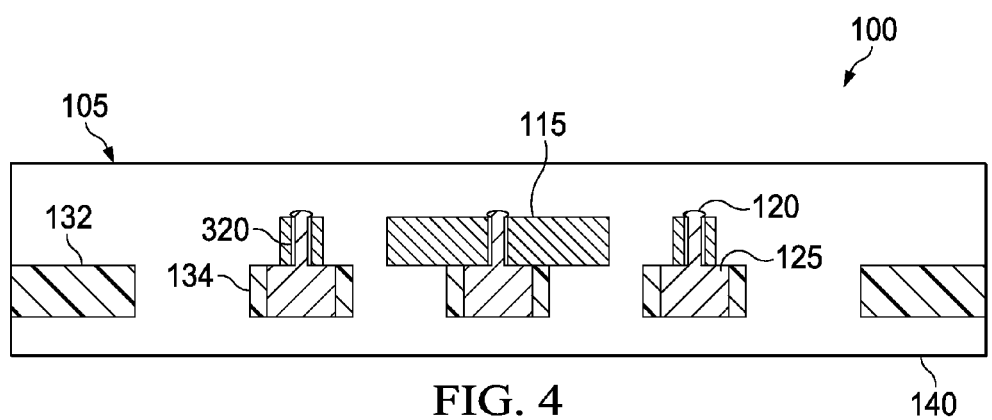

FIG. 4 shows a cross-sectional view of another alternative IC package 100, analogous to the view depicted in FIG. 2A. The low-resistance coupling 120, configured as metal studs, is a raised part of the lead frame 105 (FIG. 1) and the openings 320 in the shunt resistor 115 fits over the metal stud to couple the shunt resistor 115 and leads 125 together.

Figure 5:
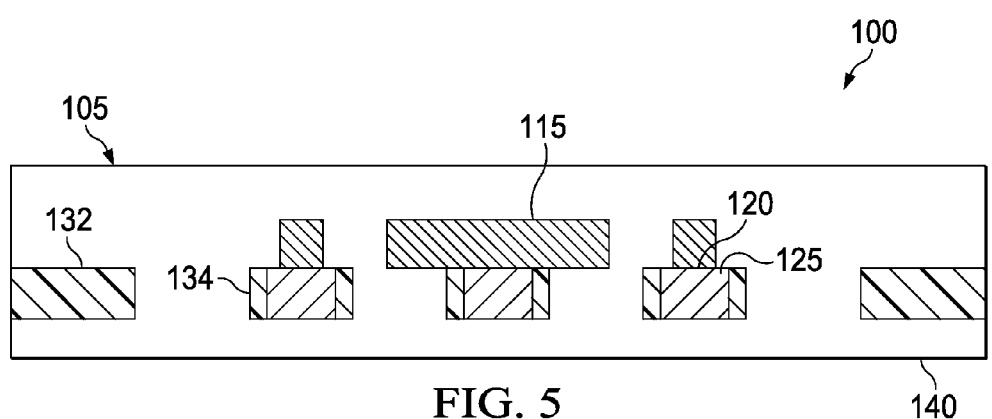

FIG. 5 presents a cross-sectional view of another alternative IC package 100. In this embodiment, there is no additional material between the shunt resistor 115 and the external leads 125. That is, the shunt resistor 115 and the external leads 125 directly contact each other to form the low-resistance coupling 120. E.g., the low-resistance coupling 120 includes, or is, a weld between the shunt resistor 115 and the external leads 125. For instance, the weld could include an electron-beam weld, a laser weld, a pressure weld, or other forms of welding that do not require the placement of additional material between the shunt resistor 115 and the external leads 125.

In such embodiments, the coupling 120 has an electrical resistivity that is substantially the same as the resistivity of the shunt resistor 115, or, the external leads 125, whichever is greater. E.g., the coupling 120 can have an electrical resistivity that is substantially equal to the resistivity of the low TCR material of the shunt resistor 115 (e.g., about 50 μOhm·cm, in some embodiments).

Electron-beam, laser and pressure welding are desirable because the dimensions embodiments of the shunt resistor 115 having this type of weld are better defined as compared to when there is an additional material (e.g., solder, conductive epoxy, or thermal grease) between the shunt resistor 115 and the external leads 125. Because the dimensions of the shunt resistor 115 are better defined, a more accurate estimate of the expected resistance of the shunt resistor 115 can be made. Additionally, electron-beam, laser and pressure welding can eliminate the potential for increased voltage losses due to the use of an additional material with a higher resistivity than either the shunt resistor 115 or external leads 125. Coupling the shunt resistor 115 and the external leads 125 by such forms of welding also has the advantage of being able to weld together dissimilar metals.

Figure 2B:
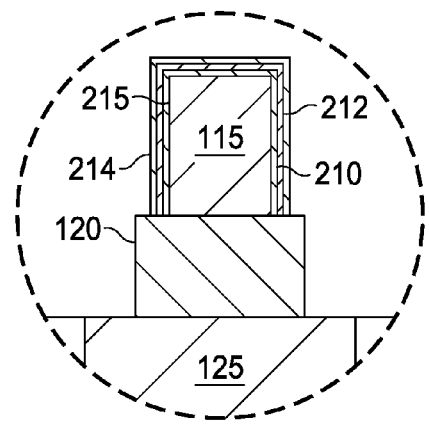

As shown in the cross-sectional view of FIG. 2B, embodiments of the shunt resistor 115 can further include one or more metal layers 210, 212, 214, located at least at the low resistance coupling 120. The metal layers 210, 212, 214 can facilitate the bonding of additional materials (e.g., solder) of the low resistance coupling 120 to the shunt resistor 115, or, to the external leads 125. The metal layers 210, 212, 214 can also improve the adhesion of a pressure weld. In such cases, there is an additional material (e.g., the metal layer itself) between the shunt resistor 115 and external leads 125.

The one or more metal layers 210, 212, 214 can promote sufficient coupling between the shunt resistor 115 and the external leads 125 without having to heat these components. Not heating these components saves energy and time in the package-manufacturing process, and helps avoid potential heat-induced damage to the IC 110 (FIG. 1).

As also shown in FIG. 2B, the metal layers 210, 212, 214 can coat the entire exterior surface of the shunt resistor 115. In some embodiments, the metal layers 210, 212, 214 are composed of nickel, palladium and gold, respectively. E.g., successive layers 210, 212, 214 of nickel, platinum and gold, can be plated onto the outer surface 215 of the shunt resistor 115 by well-known electro-deposition processes. The nickel layer 210 helps to prevent oxidation of a copper lead frame 105 or copper external lead 125, the platinum layer 212 helps bond the nickel layer 210 to the gold layer 214, and the gold layer 214 can bond strongly to certain low TCR materials (e.g. Manganin®) of the shunt resistor 115.

Figure 2C:
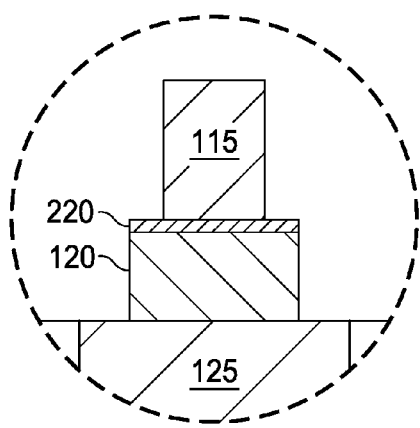

As shown in the detailed cross-sectional view of FIG. 2C, in other cases, there can be a single metal layer 220. E.g., there can be a silver layer 220 configured as a bonding pad, located at the low resistance coupling 120. Other example metals for the metal layers include tin, nickel, palladium or similar materials.

In some embodiments, the lead frame 115, including the external leads 125, can also have one or more metal layers (not shown, but analogous to that depicted in FIG. 2B or 2C) to facilitate forming the low resistance coupling 120 between the shunt resistor 115 and the external leads 125.

As illustrated in FIG. 1, to adjust the shunt resistor 115 to the appropriate length, and hence adjust its resistance, the shunt resistor 115 can have a serpentine shape. One skilled in the art would be familiar with other shapes and dimensions of the shunt resistor 115 that would be conducive to achieving a specific target resistance value.

As noted above, however, fabricating batches of shunt resistors 115 with precisely the same dimensions is difficult, and this can cause substantial variations in the resistance from one shunt resistor 115 to the next. Therefore in some embodiments, it is desirable for the resistance of each shunt resistor 115 in each IC package 100 to be calibrated, and for the IC 110 to be configured to compensate for a difference in the shunt resistor's 115 resistance from a specific target resistance value. For instance, in some cases, the IC 110 can be configured to adjust its gain to compensate for resistance variations due to variations in the dimension of the resistor 115. Such an adjustment can facilitate the IC package's 100 use for making accurate current or voltage measurements, as further discussed below. For example, for an amplifier that includes the gain-compensated IC 110 and the shunt resistor 115, the amplifier's output voltage can vary from a target value by about ±5 percent or less, or more preferably, about ±1 percent of less.

Variations in the dimensions of the shunt resistor element can give rise to large variations (e.g., about 30% variations) in its initial resistance. This difficulty was addressed by calibrating and compensating for such variations in resistance using the IC of the IC package. By measuring the resistance of each IC package after it is assembled, it is possible to use the IC to trim the output from the package to a desired value. As such, the total accuracy of the package for making current or voltage measurements is brought under the control of the IC package manufacturer.

As also shown in FIG. 1, in addition to external leads 125, the lead frame 105 can comprise a die mounting pad 130, tie bar 132, internal connections 134 (e.g., half etch leads), bonding wires 136 and other conventional lead frame components (e.g., shorting bars, dam bars, etc. . . . , not shown) to facilitate forming the integrated circuit package. All of these components of the lead frame 105 can be formed from the same material. The IC 110 can be coupled to the die mounting pad 130 using an adhesive material such as epoxy. The package 100 can further comprise a heat sink 140. The heat sink 140 can be coupled to an exterior surface 142 of the lead frame (e.g., the opposite side that the IC 110 is mounted to), or as shown in FIG. 1, to an exterior surface 145 of the IC 110, using similar adhesive materials.

Another difficulty in the manufacture of the present IC package that is not encountered by shunt resistor manufactures is encompassing IC package components with a mold 150. For clarity, the mold 150 in FIG. 1 is depicted as being transparent. The mold 150, can encompass the IC 110, shunt resistor 115, and lead frame 105 (e.g., the die mounting pad 130, tie bar 132, internal connections 134, and bonding wires 136), except for the external leads 125, and the exterior surface 155 of the heat sink 140, when present. The mold 150 can made of an epoxy, ceramic, metal or other conventional packaging materials. In addition to protecting the IC 110 against harmful environmental conditions, the mold 150 securely holds the shunt resistor 115, lead frame 105, and heat sink 140 at appropriate locations relative to the IC 110.

Both the IC 110 and shunt resistor 115 can generate substantial amounts of heat. Moreover, the shunt resistor 115 may not get the benefit of airflow cooling when it is encompassed by the mold 150. The combination of heat from the IC 110 and shunt resistor 115 can be sufficient to melt or decompose certain types of molding 150 (e.g., plastic or epoxy moldings) or degrade the performance of the IC 110. Consequently, it is important to appropriately adjust the current rating of the shunt resistor 115 to avoid such effects. One skilled in the art would understand how to model heat generation from the IC 110 and the shunt resistor 115, and to adjust the shunt resistor's 115 current rating such that the combined power output from the IC 110 and the shunt resistor 115 is below the power dissipation rating of the package 100. For example in some embodiments the power dissipation rating of the package 100 is about −500 mWatts, and the combined power output from the IC 110 and the shunt resistor 115 is below this value.

Figure 8:
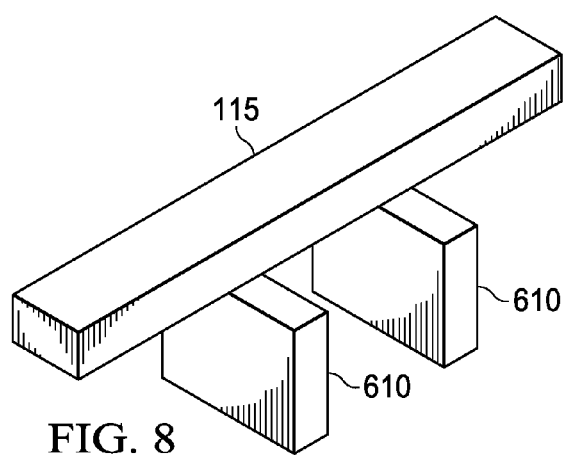
FIG. 8 presents a perspective view of the shunt resistor depicted in FIG. 6.
Figure 6:
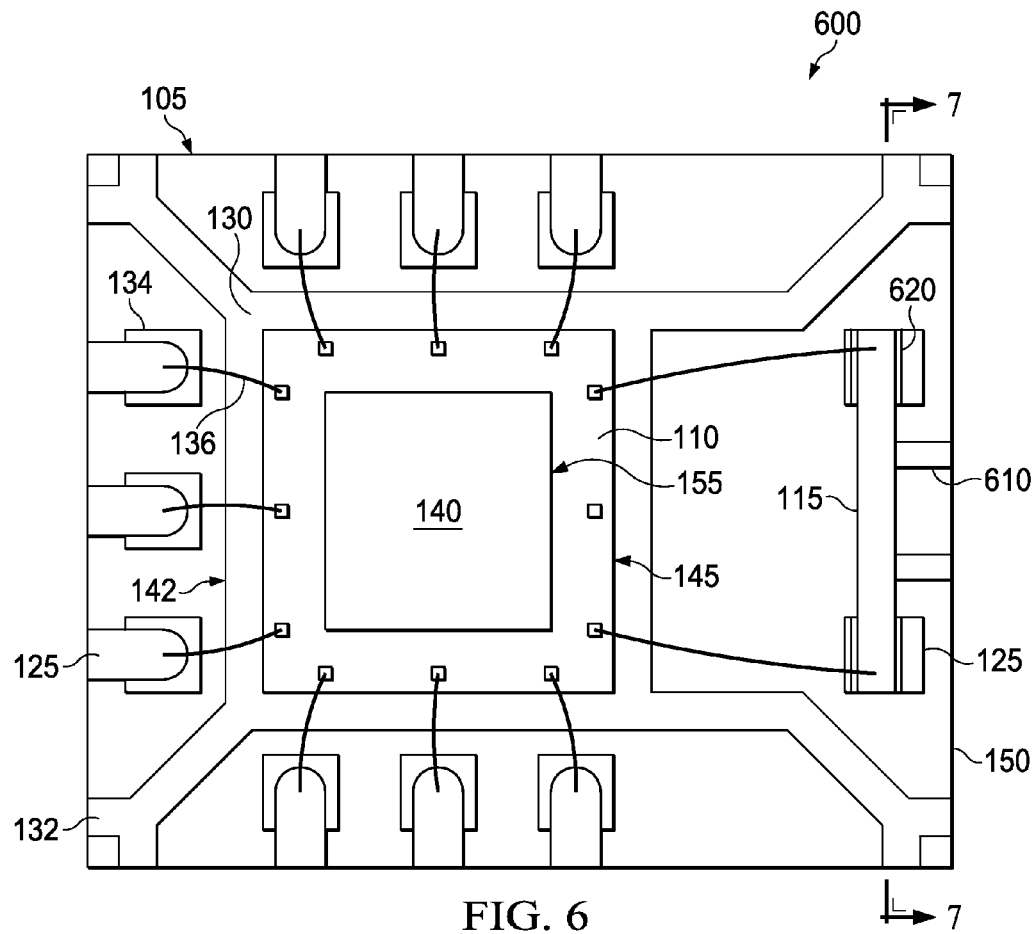
FIG. 6 illustrates a plan view of an alternative integrated circuit package of the present disclosure.
Figure 7:
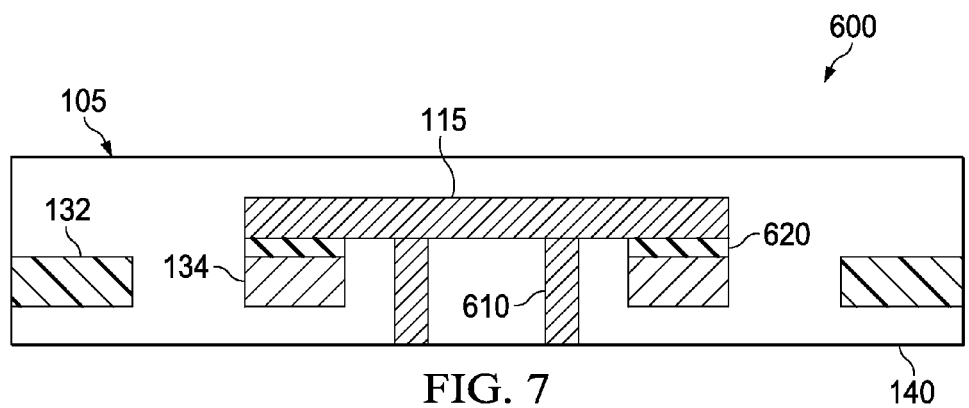
FIG. 7 presents a cross-sectional detail view of the integrated circuit package depicted in FIG. 6.

FIG. 6 shows a plan view of another example IC package 600 of the present disclosure. FIG. 7 shows a cross-sectional view of the same IC package 600 through view 6-6 (FIG. 6). FIG. 8 presents a perspective view of the shunt resistor 115 depicted in FIGS. 6 and 7.

The package 600 is analogous to the QFN packages depicted in FIGS. 1-5, and like reference numbers are used to depict like components. E.g., the package 600 comprises the analogous lead frame 105, IC 110 located on the lead frame 105, and shunt resistor 115 coupled to the lead frame 105 and IC 110. Any of the materials of the lead frame 105 and shunt resistor 115 discussed above in the context of FIGS. 1-5 can be used in the package 600. E.g., the shunt resistor 115 has a lower TCR than the lead frame 105, and the lead frame 105 has a lower resistivity than the shunt resistor 115. Unlike the packages 100 shown in FIGS. 1-5, however, the shunt resistor 115 of the package 600 does not have the low-resistance coupling 120 to external leads 125 of the lead frame 105 (FIGS. 1-5). Rather, the shunt resistor 115 has its own integrated external leads 610. For instance, as shown in FIG. 8, one continuous piece of low TCR material can be used to form both the shunt resistor 115 and the integrated external leads 610. The shunt resistor 115 depicted in FIGS. 6-8 can be configured to have any of the above-described shapes (e.g., linear or serpentine) as needed to provide the desired resistance.

As shown in FIGS. 6 and 7, an additional coupling material 620 may be used to attach the shunt resistor 115 to the lead frame 105. Any of the materials and processes discussed in the context of FIGS. 1-5 to form the low resistivity coupling 120 used as the additional coupling material 620. Unlike the low resistivity coupling 120, however, the additional coupling material 620 need not have a low resistivity, and can even be an electrical insulator. Or, the additional coupling 620 can include welds (e.g., electron beam, laser or pressure welds) with no additional material.

A shunt resistor 115 with integrated external leads 610 has certain advantages over coupling the shunt resistor 115 to external leads 125 from the lead frame 105. The shunt resistor 115 can be directly connected to an device external to the package 600 without having to interface with another material having a different TCR than the shunt resistor 115, such as the external leads 125 from the lead frame 105, or, the additional coupling material 120 (FIG. 1). This, in turn, allows one to avoid the variable resistances associated with using different materials, having different TCRs, to interface the shunt resistor 115 to external elements. Providing a shunt resistor 115 with its own external leads 610 facilitates having a constant pin resistance and therefore having a constant voltage drop across the shunt resistor 115. Additionally, the materials and processing steps to couple the shunt resistor 115 to the external lead 125 of the lead frame 105, are eliminated, thereby making the manufacturing process more efficient.

Figure 9A:
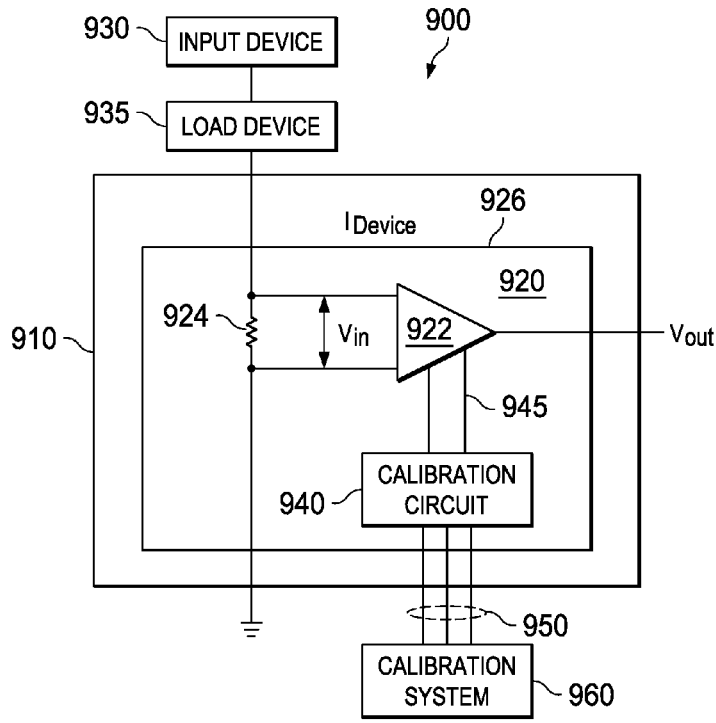
FIGS. 9A and 9B present block diagrams of example embodiments of an amplifier of the present disclosure.
Figure 9B:
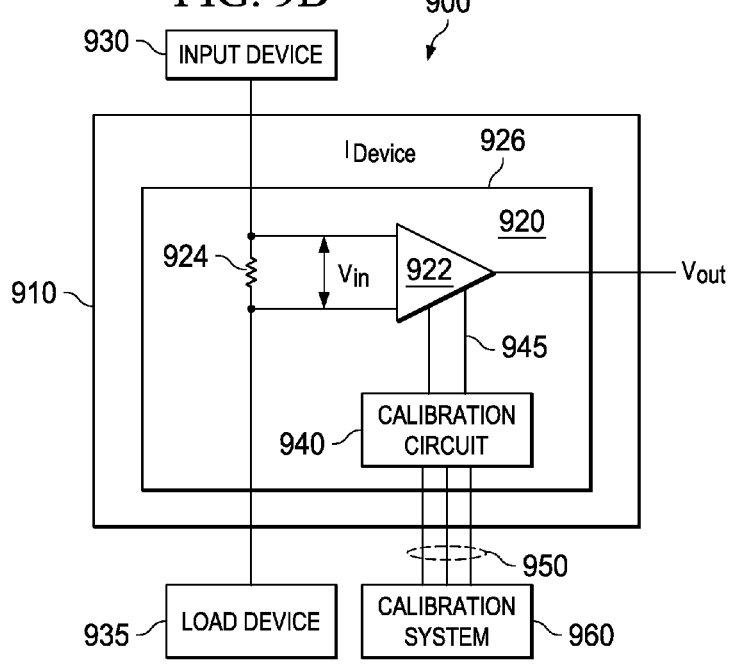

FIGS. 9A and 9B show block diagrams of another aspect of the present disclosure, an amplifier 900 for current or voltage measurements. The amplifier comprises an IC package 910. The package 910 can be any of the above-described embodiments of the IC packages discussed in the context of FIGS. 1-8. The package 910 includes a lead frame 920, IC 922 on the lead frame 920, and shunt resistor 924. The lead frame 920, and shunt resistor 924 have the above-described TCR and resistivity properties. The shunt resistance 924 is coupled to the lead frame 920 and electrically connected to the IC 922. As discussed above in the context of FIGS. 1-8, the shunt resistor 924 can its own external leads, or, has a low-resistance coupling to external leads of the lead frame. Additionally, the package 910 includes a mold 926 that encompasses the lead frame 920, shunt resistor 924, and IC 922, except for the external leads of lead frame 920 or shunt resistor 924.

One of ordinary skill in the art would be familiar with various possible configurations the amplifier 900 could have to facilitate a current- or voltage-sensing function. E.g., the shunt resistor 924 can be coupled via its own external leads, or, via external leads of the lead frame 920, to an input device 930 and to a load device 935.

FIG. 9A presents a low-side sensing configuration. FIG. 9B presents a high-side sensing configuration. One skilled in the art would appreciate the other sensing configurations that could be used. In some embodiments, to measure the current ($I_{device}$) passing through the input device 930, the voltage potential drop ($V_{in}$) across the shunt resistor 924, is read as an input to the IC 922, to produce an output voltage ($V_{out}$) from which $I_{device}$ can be calculated.

The amplifier 900 can further comprise additional components to facilitate the measurement of current or voltage. E.g., the amplifier 900 can also include a calibration circuit 940 that is electrically connected to the IC 922. The calibration circuit 940 can also be encompassed by the mold 926, or, can be external to the mold 926. The calibration circuit 940 can be configured to facilitate adjustment of the gain of the amplifier IC 922, using procedures well known to those skilled in the art. E.g., the calibration circuit 940 can include a network of parallel resistors, each resistor having a different value in a desired range governed by design considerations. In some embodiments, the parallel resistors of the calibration circuit 940 comprise the same low TCR material used to form the shunt resistor 924, or, in other cases is included in other topological configurations. The calibration circuit 940 can be connected via conventional input/output lead 945 to the IC 922, and via a data bus 950, to a conventional calibration system 960 that is external to the package 910. Additional aspects of the amplifier 900, including its operation and components, are further described in U.S. Pat. No. 6,225,684 to Stitt et al., which is incorporated by reference in its entirety.

Another aspect of the present invention is a method of manufacturing an integrated circuit package. The method of manufacturing an integrated circuit package can be used to produce any of the embodiments of the integrated circuit package presented in FIGS. 1-9B and discussed above.

Figure 10:
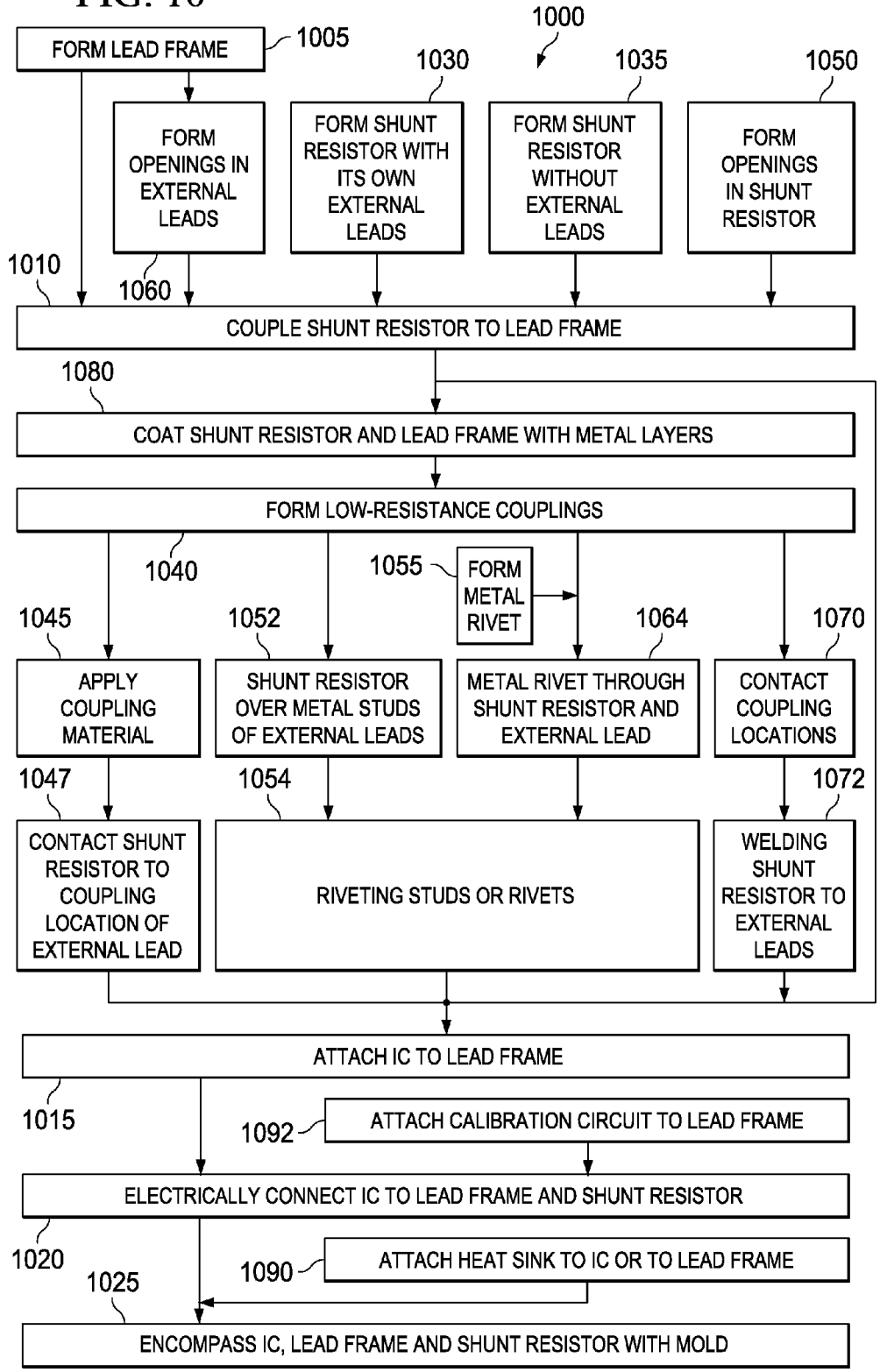
FIG. 10 illustrates by flow diagram, selected steps in an example method for manufacturing an integrated circuit package according to the present disclosure.

FIG. 10 illustrates by flow diagram, selected steps in an example method 1000 for manufacturing an integrated circuit package according to the principles of the present disclosure.

The method 1000 includes forming a lead frame (step 1005), coupling a shunt resistor to the lead frame (step 1010), attaching an IC to a surface of the lead frame (step 1015), electrically connecting the IC to the shunt resistor and to the lead frame (step 1020), and encompassing the shunt resistor and IC with a mold (step 1025), except for external leads of the lead frame, or, of the shunt resistor.

As noted above, the shunt resistor and lead frame are composed of different materials such that the shunt resistor has a lower temperature coefficient of resistance than the lead frame, and the lead frame has a lower resistivity than the shunt resistor. In some embodiments, the shunt resistor is formed so as to have its own integrated external leads (step 1030) while in other embodiments, the shunt resistor is formed without having its own external leads (step 1035). In the latter case, low-resistance couplings to external leads is formed (step 1040) as part of coupling the shunt resistor to the lead frame (step 1010).

Some embodiments of the low-resistance coupling include solder, conductive epoxy, or thermal grease having an electrical resistivity of about 2 mOhm·cm or less. In such embodiments, coupling the shunt resistor to the lead frame in step 1010 includes a step 1045 of applying a low-resistance coupling material (e.g., the solder, conductive epoxy, or thermal grease) to one or both of coupling locations on the shunt resistor or on the external leads of the lead frame. Then in step 1047, the shunt resistor is contacted to the external leads at the coupling locations.

Other embodiments of the low-resistance coupling include one or more metal studs or metal rivets having an electrical resistivity of about 2 mOhm·cm or less. In some instances, the metal stud can be formed as part the external lead during the formation of the lead frame in step 1005. In such embodiments, coupling the shunt resistor to the lead frame in step 1010 and forming the low resistance coupling (step 1040) can include a step 1050 of forming openings in the shunt resistor, a step 1052 of positioning the shunt resistor on the external leads such that the metal studs of the external leads fit through individual ones of the openings, and then riveting (step 1054) an exposed end of each of the metal studs such that the exposed end expands to cover one of the openings.

In other instances, a metal rivet can be formed (step 1055) separately from forming the lead frame in step 1005. In such embodiments, coupling the shunt resistor to the lead frame in step 1010 and forming the low resistance coupling (step 1040) can include forming openings in the shunt resistor (step 1050) and/or in the external leads (step 1060), a step 1064 of positioning metal rivets through individual ones of the openings, and then performing a riveting step 1054 such that exposed ends of each of the metal rivets expands to cover the openings.

In still other embodiments, the low-resistance coupling does not include additional material between the lead frame and the shunt resistor. In such embodiments, coupling the shunt resistor to the lead frame in step 1010 can include a step 1070 of making contact of the shunt resistor to coupling locations of the external leads of the lead frame, and then a step 1072 of directly welding the shunt resistor (e.g., electron beam, laser or pressure welding) to the external leads at the coupling locations.

In some embodiments, before coupling the shunt resistor to the lead frame in step 1010, there is an additional step 1080 of coating at least the coupling locations of the shunt resistor to the lead frame (e.g., the external leads) with one or more metal layers of Ni, Pd, Au or Ag. In some embodiments, the entire shunt resistor, entire lead frame or both the shunt resistor and the lead frame are coated in step 1080.

One skilled in the art would be familiar with the various embodiments that could be applied to accomplish steps 1005, 1015, 1020 and 1025. E.g., forming the lead frame in step 1005 can include forming a layout pattern for the lead frame on a metal sheet, stamping or etching the metal sheet to form the lead frame pattern, and trimming the lead frame pattern to form the lead frame's component structures (e.g., leads, die mounting pad, tie bar etc. . . . ). E.g., attaching the IC to a surface of the lead frame in step 1015 can include bonding the IC to the die mounting pad of the lead frame using a resin or other conventional adhesive. E.g., electrically connecting the IC to the shunt resistor and to the lead frame in step 1020 can be accomplished by forming bonding wires between the IC and the external leads and between the shunt resistor and IC. E.g., encompassing the shunt resistor and IC with a mold in step 1025 can include surrounding these components with an injection mold or a coating of epoxy resin, ceramic, or other conventional insulating material. Lead frame structures, such as dam bars, can facilitate preventing the external leads of the lead frame or shunt resistor from being encompassed by the mold.

Additional steps to complete the package's manufacture can include attaching a heat sink (step 1090) to an exterior surface of the integrated circuit or the lead frame (e.g., to the underside of the die mounting pad), coupling a calibration circuit to the lead frame (step 1092), and making electrical connections between the IC and calibration circuit and between the calibration circuit and input/output pins (e.g., as part of making other electrical connections in step 1020).

Figure 11:
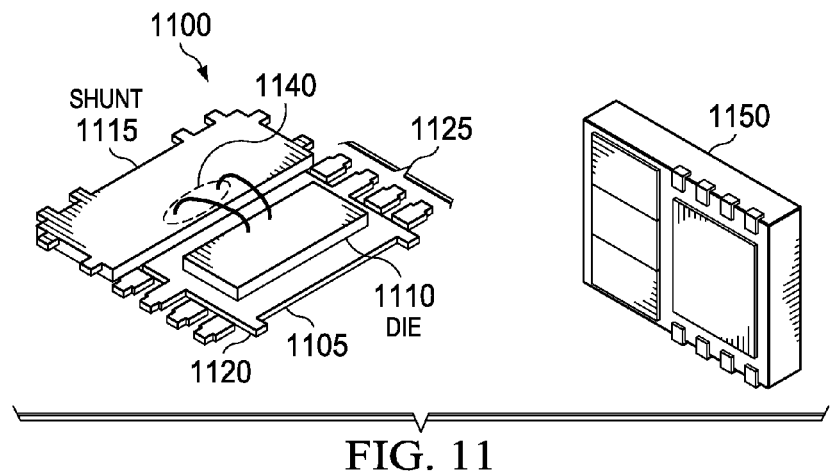
FIG. 11 illustrates an embodiment showing the shunt without direct connection to the leadframe.

FIG. 11 illustrates an embodiment showing the shunt without direct connection to the leadframe. The example package 1100 comprises a lead frame 1105, an integrated circuit 1110 located on the lead frame 1105, and a shunt resistor 1115. Shunt resistor 1115 has connections 1140 to the IC. In this embodiment, there are no interconnects between shunt resistor 1115 and the leadframe 1120. This allows for better current handling capability and reduce of interconnect material risks. The shunt resistor 115 also has a low-resistance connections exposed out of the package with direct connections to an external components such as a printed circuit board. A packaged device is shown 1170.

Figure 12:
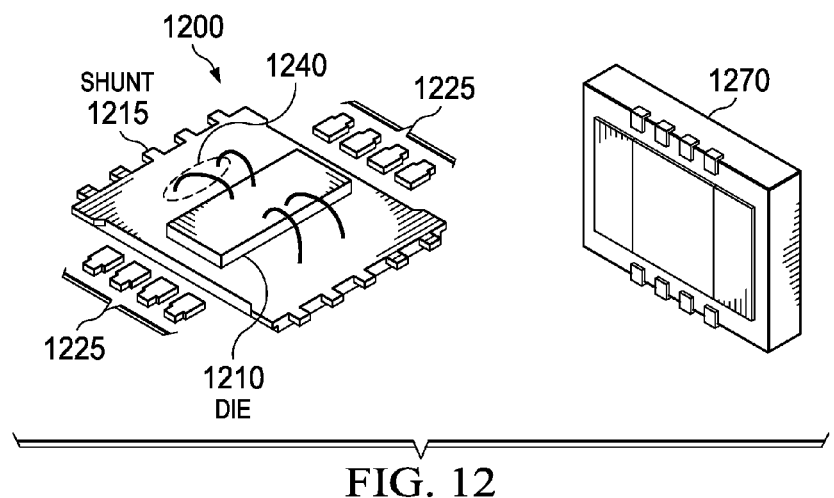
FIG. 12 illustrates an embodiment showing the shunt without connection to the leads.

FIG. 12 illustrates an embodiment showing the shunt without connection to the leads. This example package 1200 comprises an integrated circuit 1210 and a shunt resistor 1215. Shunt resistor 1215 has connections 1240 to the IC. In this embodiment, there are no interconnects between shunt resistor 1215 and the leadframe. This allows for better current handling capability and reduce of interconnect material risks. The shunt resistor 1215 also has a low-resistance connections exposed out of the package 1225 with direct connections to an external components such as a printed circuit board. A packaged device is shown 1270.

Although the embodiments of the invention has been described in detail, those skilled in the art should understand that they could make various changes, substitutions and alterations herein without departing from the scope of the invention in its broadest form.

What is claimed is:

1. An integrated circuit package, comprising:
a lead frame;
an integrated circuit located on said lead frame; and
a shunt resistor coupled to said lead frame and to said integrated circuit, wherein:
said shunt resistor has a lower temperature coefficient of resistance than said lead frame,
said lead frame has a lower resistivity than said shunt resistor, and
said shunt resistor has a low-resistance coupling to external leads for a direct connection to external devices without having to interface with another material having a different temperature co-efficient of resistivity (TCR) than said shunt resistor.

2. The IC package as recited in claim 1, wherein said temperature coefficient of resistance of said shunt resistor is at least about 100 times lower than a temperature coefficient of resistance of said lead frame.

3. The IC package as recited in claim 1, wherein said resistivity of said lead frame is at least about 10 times lower than a resistivity of said shunt resistor.

4. The IC package as recited in claim 1, wherein said temperature coefficient of resistance of said shunt resistor is about ±100 ppm/° C. or less.

5. The IC package as recited in claim 1, wherein said shunt resistor is composed of a metal alloy that includes copper, nickel and manganese.

6. The IC package as recited in claim 1, wherein said low-resistance coupling includes a solder, a conductive epoxy, or a thermal grease, that have an electrical resistivity of about 2 mOhm·cm or less.

7. The IC package as recited in claim 1, wherein said low-resistance coupling includes metal studs or rivets having an electrical resistivity of about 2 mOhm·cm or less.

8. The IC package as recited in claim 1, wherein said low-resistance coupling includes an electron-beam, laser or pressure weld between said shunt resistor and said external leads.

9. The IC package as recited in claim 1, wherein said shunt resistor further includes one or more metal layers, said metal layers being located at least at said low resistance coupling.

10. The IC package as recited in claim 1, wherein a gain of said IC is configured to compensate for a different in a resistance of said shunt resistor from a target resistance value.

11. The IC package as recited in claim 1, further including a mold encompassing said integrated circuit, said shunt resistor and said lead frame, except for said external leads of said lead frame or of said shunt resistor.

12. An amplifier for current or voltage measurements, comprising:
an integrated circuit package, including:
a lead frame;
an integrated circuit located on said lead frame;
a shunt resistor coupled to said lead frame and to said integrated circuit, wherein:
said shunt resistor has a lower temperature coefficient of resistance than said lead frame,
said lead frame has a lower resistivity than said shunt resistor, and
said shunt resistor has a low-resistance coupling to external leads for a direct connection to external devices without having to interface with another material having a different temperature co-efficient of resistivity (TCR) than said shunt resistor; and
a mold encompassing said lead frame, said shunt resistor, and said integrated circuit, except for said external leads of said shunt resistor.

13. A method of manufacturing an integrated circuit package, comprising:
forming a lead frame;
attaching an integrated circuit to a surface of said lead frame;
electrically connecting said integrated circuit to said shunt resistor and to said lead frame, wherein
said shunt resistor has a lower temperature coefficient of resistance than said lead frame,
said lead frame has a lower resistivity than said shunt resistor, and
said shunt resistor has its own integrated external leads for a direct connection to external devices without having to interface with another material having a different temperature co-efficient of resistivity (TCR) than said shunt resistor
encompassing said lead frame, said shunt resistor and said integrated circuit with a mold, except for said integrated external leads of said shunt resistor.

* * * * *